(12) United States Patent
Boudry

(10) Patent No.: US 6,636,088 B2
(45) Date of Patent: Oct. 21, 2003

(54) EDGE MULTIPLIER CIRCUIT

(75) Inventor: Jean-Marie Boudry, Beynes (FR)

(73) Assignee: Bull S.A., Louveciennes (FR)

( * ) Notice: Subject to any disclaimer, the term of this patent is extended or adjusted under 35 U.S.C. 154(b) by 0 days.

(21) Appl. No.: 10/005,762

(22) Filed: Dec. 7, 2001

(65) Prior Publication Data

US 2002/0113630 A1 Aug. 22, 2002

(30) Foreign Application Priority Data

Dec. 7, 2000 (FR) .......................................... 00 15856

(51) Int. Cl.$^7$ .............................................. H03B 19/00
(52) U.S. Cl. ...................... 327/119; 327/153; 327/158; 327/269; 327/270
(58) Field of Search ................................ 327/113, 114, 327/116, 117, 119, 120, 121, 269, 270, 276, 149, 145, 153, 156, 158

(56) References Cited

U.S. PATENT DOCUMENTS

| | | | | |
|---|---|---|---|---|
| 5,260,608 A | * | 11/1993 | Marbot | 327/158 |
| 5,422,835 A | | 6/1995 | Houle et al. | |
| 5,548,235 A | * | 8/1996 | Marbot | 327/158 |
| 5,552,726 A | * | 9/1996 | Wichman | 327/149 |
| 6,037,812 A | * | 3/2000 | Gaudet | 327/116 |
| 6,441,657 B1 | * | 8/2002 | Saeki | 327/119 |

FOREIGN PATENT DOCUMENTS

| | | |
|---|---|---|
| EP | 608 972 A | 8/1994 |
| FR | 2 658 015 | 8/1991 |

* cited by examiner

*Primary Examiner*—Timothy P. Callahan
*Assistant Examiner*—An T. Luu
(74) *Attorney, Agent, or Firm*—Edward J. Kondracki; Miles & Stockbridge P.C.

(57) ABSTRACT

An edge multiplier circuit comprises a chain of N phase-looped delay cells (130, 131, 132, 133, 134). An order of cells to be delayed is determined by action loops. A first action loop (116, . . . , 128) is utilized for values of j varying from 1 to N, each corresponding to a total delay equal to j times an elementary delay ($T_e$) of a cell. The delay is applied to the chain of N delay cells. An action of the first loop comprises a second action loop (118, . . . , 127) for values of i varying from 1 to N, each corresponding to a rank of a cell in said chain. An action of the second loop calculates a delay error (a (j, i)) output from the cell of rank i relative to an ideal delay that distributes the total delay of the chain equally to each cell. A first value of the error is calculated prior to activating an additional elementary delay ($T_e$) of the cell of rank i and a second value of the error is calculated if the first value is higher than a predetermined threshold, after activating an additional elementary delay of said cell of rank i. The rank i in this case completes the order to be determined.

24 Claims, 6 Drawing Sheets

EDGE MULTIPLIER CIRCUIT

BACKGROUND OF THE INVENTION

1. Field of the Invention

The invention relates to an edge multiplier circuit. A circuit of this type can be used, for example, to obtain several phase-shifted clock signals from the same reference clock signal. A circuit of this type can also be used to obtain a clock signal with a higher frequency than a reference clock signal.

2. Description of Related Art

French patent application FR2658015 (U.S. Pat. No. 5,260,608, U.S. Pat. No. 5,548,235 and U.S. Pat. No. 5,838,178 in the United States) describes a phase-locked circuit that makes it possible to produce a frequency multiplier. Compared to known circuits of the VCO, or voltage-controlled type, this circuit has the advantage of a short response time and good noise immunity. A delay circuit within it is driven by the output signal of a phase comparator between the input signal and the output signal of the delay circuit. The delay circuit within it is constituted by a number N of cascading cells such that the control signal controls an elementary delay increment $T_e$ of each cell. Since the control signal drives the N cells simultaneously, the minimum delay increment of the delay circuit is equal to N times the elementary delay increment $T_e$ of each cell. The delay circuit in this prior art makes it possible to correct a phase error between its input and its output with a precision of N times $T_e$ at best.

One object of the present invention is to correct a phase error between the input and the output of a delay circuit with better precision than N times $T_e$. This offers an advantage in attaining high frequencies, even though minimum value of an elementary delay increment $T_e$ is necessarily limited by the production technology of the circuit. In one solution of the present invention, the output signal of the phase comparator does not drive the N cells simultaneously, but actuates each cell separately.

The proposed solution is not obvious because driving all of the cells simultaneously guarantees that the duty cycle of the signal is maintained. In fact, it is noted that in a delay circuit of the prior art, incrementing the delay of only one cell at a time poses a problem. For a phase error of $T_e$, before correction, the output signal of each cell has a phase error of n times $T_e/N$ relative to the ideal phase, n varying from 1 for the first cell at the input of the delay circuit, to N for the last cell at the output of the delay circuit.

A command for successively incrementing each cell in cascading order is not satisfactory. A correction of $T_e$ in the first cell produces a phase error equal to $(N-1)T_e/N$ relative to the ideal phase, followed by a phase error equal to $(N-n)T_e/N$ in each cell up to the last one, for which the phase error equal to $(N-N)/T_e/N$ is null. In a frequency multiplier in which the output signals of all or some of the cells are combined, this can have the consequence of modifying the duty cycle of $(N-1)T_e/N$. The phase error results in the obtainment of a phase-shifted clock signal starting with an $n^{th}$ cell. The phenomenon is further amplified for a phase error throughout the delay circuit, greater than $T_e$.

A command for successively incrementing each cell in reverse cascading order is not satisfactory, either. Starting with the center cell of the delay circuit carries the problem over to both the preceding group of cells and the following group of cells, adding to this the problem of choosing which group of cells to use for a subsequent correction.

SUMMARY OF THE INVENTION

The object of the invention is to create an edge multiplier circuit using a delay circuit constituted by cells connected in cascade, phase-looped back to its input, while avoiding the aforementioned drawbacks of the prior art.

The subject of the invention is a method for determining an order of cells to be delayed in a chain of N phase-looped delay cells. The method comprises:

a first action loop for values j varying from 1 to N, each corresponding to a total delay equal to j times an elementary delay of a cell, to be applied to the chain of N delay cells, an action of the first loop comprising:

a second action loop for values i varying from 1 to N, each corresponding to a rank of a cell in said chain, an action of the second loop calculating a delay error output from the cell of rank i relative to an ideal delay that distributes the total delay of the chain equally to each cell, in such a way that:

a first value of said error is calculated prior to activating any additional elementary delay of the cell of rank i;

a second value of said error is calculated if the first value is higher than a predetermined threshold, after activating an additional elementary delay of said cell of rank i, said rank i completing said order to be determined.

The order determined by the method according to the invention makes it possible to produce an edge multiplier circuit in which an additional elementary delay is progressively applied to a new cell in the order determined, in order to minimize the error output from each cell relative to an ideal delay distributed equally among all the cells. The implementation of the method for values of N varying from 3 to 20 and beyond made it possible to observe a maximum error equivalent to the elementary delay.

BRIEF DESCRIPTION OF THE DRAWINGS

The characteristics and advantages of the invention will emerge from the following description given as an example and written in reference to the attached drawings.

In the drawings.

DESCRIPTION OF THE PREFERRED EMBODIMENTS

Figure 1:
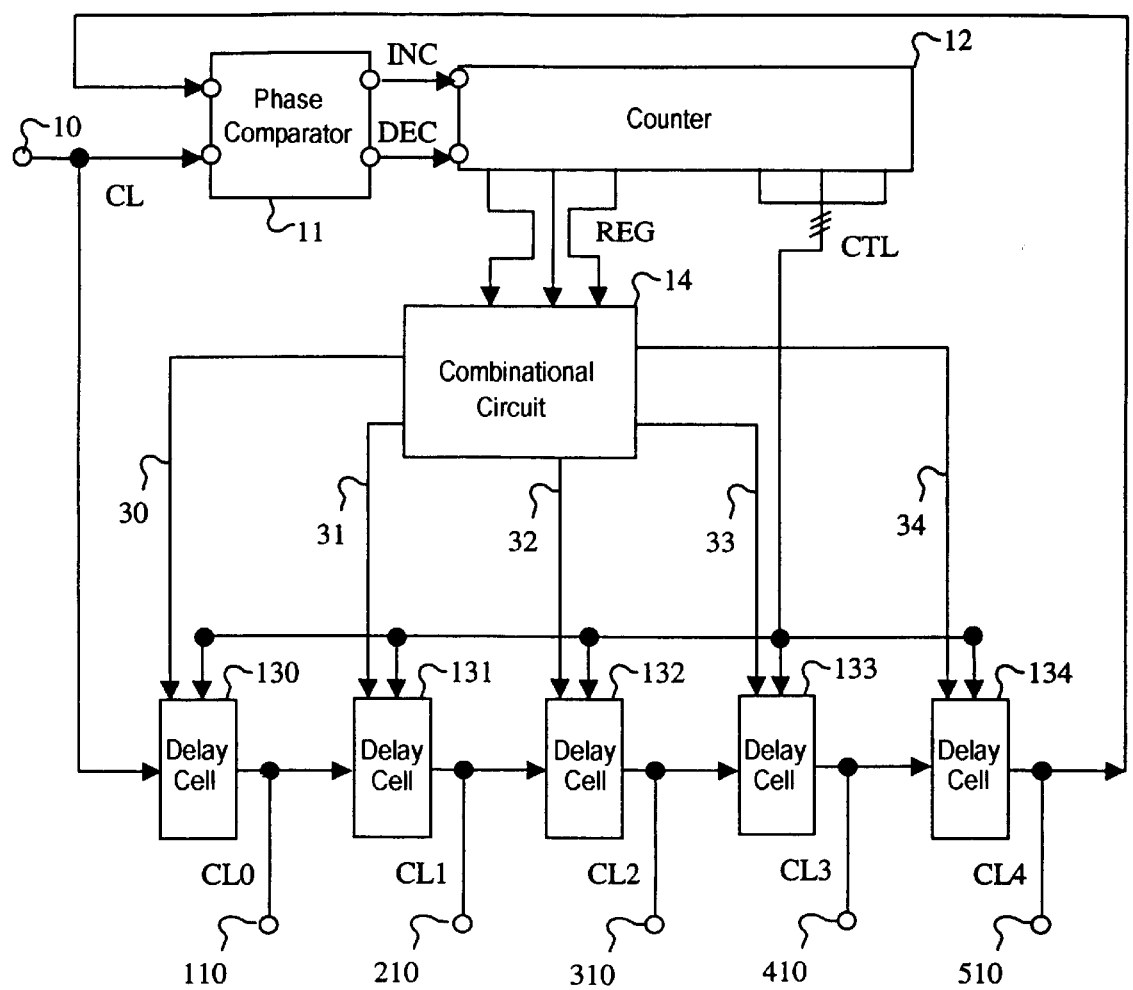
FIG. 1 schematically illustrates a phase-locked circuit according to the invention.

Referring to FIG. 1, a number N of delay cells 130, 131, 132, 133, 134 are connected in cascade in such a way that the cell 130 receives as input an oscillating signal CL so as to generate as output an oscillating signal CL0, the cell 131 receives as input the oscillating signal CL0 so as to generate as output an oscillating signal CL1, the cell 132 receives as input the oscillating signal CL1 so as to generate as output an oscillating signal CL2, the cell 133 receives as input the oscillating signal CL2 so as to generate as output an oscillating signal CL3, the cell 134 receives as input the oscillating signal CL3 so as to generate as output an oscillating signal CL4. Each signal is generated as output from the cell with a frequency identical to that of the signal received as input and with a delay specific to each cell. The delay thus accumulated by the cells 130–134 results in a phase shift of the signal CL4 relative to the signal CL.

The phase of the signal CL4 is compared to the phase of the signal CL in a known phase comparator 11 with a binary result: phase lead or phase lag. When the phase of the signal CL4 is lower than the phase of the signal CL, the phase comparator 11 generates a signal INC. When the phase of the signal CL4 is higher than the phase of the signal CL, the phase comparator 11 generates a signal DEC.

The signal INC increments a non-cyclic reversible binary counter 12. In the description below, this reversible counter will simply be called a counter 12. The signal DEC decrements the binary counter 12. The value of the counter 12 is broken down into two signals REG and CTL. The low order bits, in keeping with an appropriate coding, constitute the first signal REG. The high order bits, in keeping with the appropriate coding, constitute the second signal CTL. The number of low order bits is chosen so as to encode the number of cells 130–134. In the example of FIG. 1, the number of cells being five, the number of low order bits is three in order to encode five binary values, for example in the natural order: 000, 001, 010, 011, 100. These binary values are the internal states of the counter. The remaining bits constitute the high order bits.

The counter 12 is embodied such that each time the number N is reached in the low order bits, it causes a reset of these bits to zero and generates a carry, which increments the value represented by the high order bits. When the number N of cells is a power of two, the counter 12 is a conventional counter. When the number N of cells is not a power of two, as is for example the case in FIG. 1, the counter 12 is modified in a way that is obvious to one skilled in the art. If the number of cells is five, the combinational circuit of the counter 12 is such that with the code chosen, an incrementation of the value 100 causes a reset of the highest order bit to one instead of setting the lowest order bit to one and generates a carry propagated to the high order bits. Conversely, when the counter decrements, the state 000 is followed by the state 100.

Figure 2:
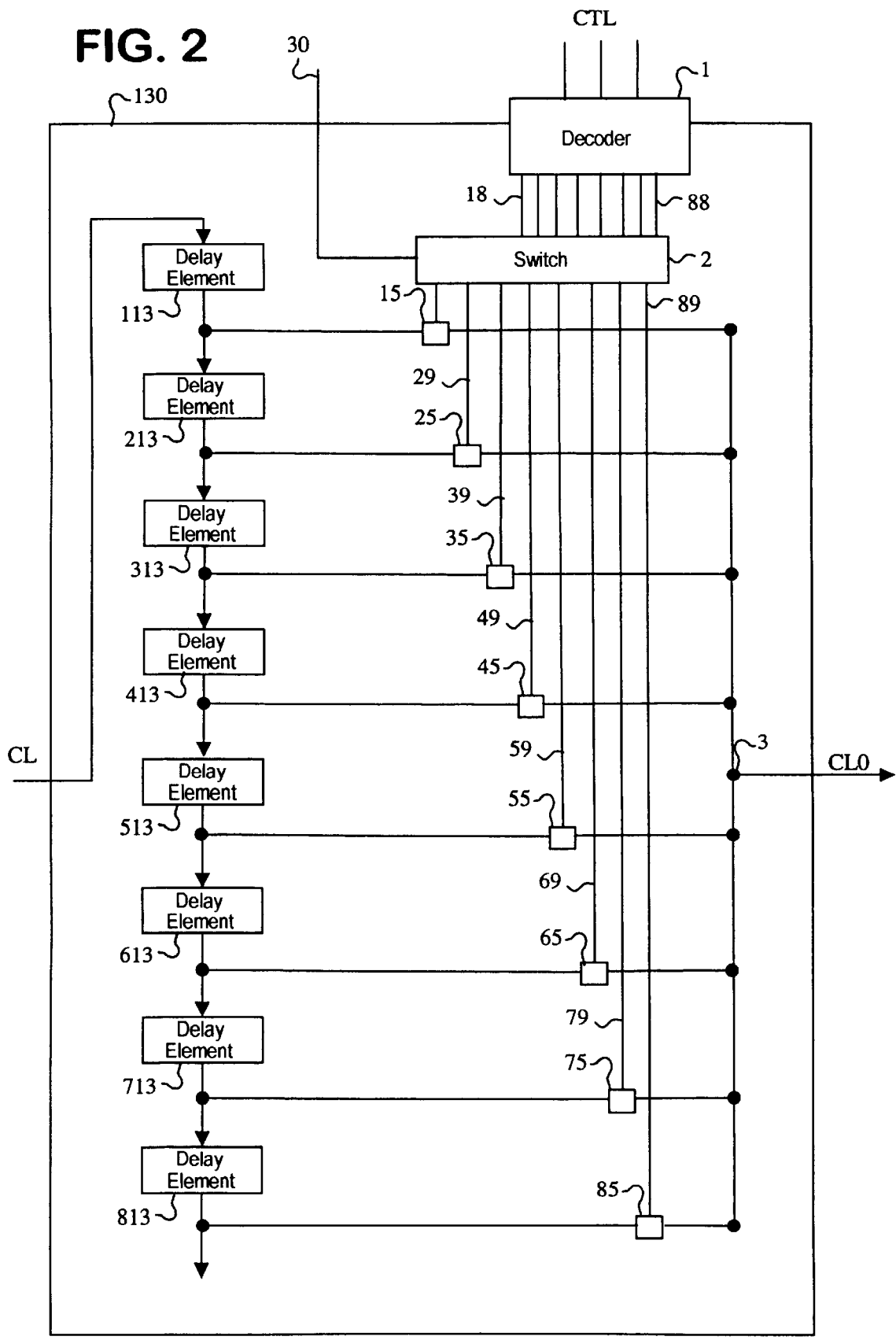
FIG. 2 schematically illustrates a delay cell according to the invention.

The signal CTL directly controls each of the cells 130 through 134 as explained in greater detail in the description in reference to FIG. 2. Each bit of the signal CTL is conveyed by a different lead. In the example of FIG. 1, three high order bits make it possible to encode eight values. In order not to overcomplicate the figure, all of the leads are represented by a single line intersected by three oblique lines, which indicate that this line comprises three leads in parallel.

The signal REG indirectly controls each of the cells 130 through 134 in a way explained in greater detail in the description in reference to FIG. 2. The bits of the signal REG are decoded by a combinational circuit 14. The combinational circuit 14 generates as many one-bit signals as there are delay cells, a binary signal 30 sent to the cell 130, a binary signal 31 sent to the cell 131, a binary signal 32 sent to the cell 132, a binary signal 33 sent to the cell 133, a binary signal 34 sent to the cell 134.

In the case where N=5, based on the internal states of the three low order bits, the combinational circuit 14 generates five signals REG1, REG2, REG3, REG4, REG5 encoded according to the following truth table:

| Internal state | REG1 | REG2 | REG3 | REG4 | REG5 |
|---|---|---|---|---|---|
| 000 | 0 | 0 | 0 | 0 | 0 |
| 001 | 1 | 0 | 0 | 0 | 0 |
| 010 | 1 | 1 | 0 | 0 | 0 |
| 011 | 1 | 1 | 1 | 0 | 0 |
| 100 | 1 | 1 | 1 | 1 | 0 |

In fact, only N−1 signals are significant; in essence, a reset of the signal REG to zero by incrementation causes an incrementation of the signal CTL by carry propagation which, as will be seen below, produces the same effect as setting all of the signal REG1 through REG5 to 1 without an incrementation of the signal CTL. Hence, the signal REG5 is not necessarily generated.

As explained in the description below, the method according to the invention makes it possible to etch traces of the combinational circuit 14 in such a way as to assign each of the signals REG1, REG2, REG3, REG4 and possibly REG5 to one of the signals 30, 31, 32, 33, 34.

As the start of the circuit represented in FIG. 1, the value of the counter 12 is at zero. As explained below in reference to FIG. 2, the signal CTL and the signal REG in this case control a minimum delay value for each of the N cascaded cells 130 through 134. The minimum delay of each cell is chosen so as to produce a phase lag of the last signal CL4 relative to the reference signal CL that is sharply lower than a period of 2·. The resulting negative phase shift in the input of the phase comparator 11 causes an incrementation of the counter 12 until its value activates, in the cells 130 through 134, a delay that results in a phase shift greater than or equal to zero in the input of the comparator 11. A positive phase shift in the input of the comparator 11 causes a decrementation of the counter 12.

When the last signal CL4 is in phase with the reference signal CL, each of the signals CL1 through CL4 is regularly phase shifted by a nearly identical portion of a period relative to the respective signal CL1 through CL3 that precedes it. Recovering the signal CL0 in a terminal 110, the signal CL1 in a terminal 210, the signal CL2 in a terminal 310, the signal CL3 in a terminal 410, the signal CL4 in a terminal 510 produces a frequency edge multiplier that is an exact multiple of the frequency of the edges of the signal CL.

The cell 130 will now be explained in greater detail in reference to FIG. 2.

The cell 130 comprises a certain number M of delay elements 113, 213, 313, 413, 513, 613, 713, 813. The delay element 113 receives as input the signal CL. The delay element 213 receives as input the output of the delay element 113. The delay element 313 receives as input the output of the delay element 213. The delay element 413 receives as input the output of the delay element 313. The delay element 513 receives as input the output of the delay element 413. The delay element 613 receives as input the output of the delay element 513. The delay element 713 receives as input the output of the delay element 613. The delay element 813 receives as input the output of the delay element 713. The signal CL0 is obtained in a node 3 of the cell 130. A switch 15 is connected between the output of the delay element 113 and the node 3. A switch 25 is connected between the output of the delay element 213 and the node 3. A switch 35 is connected between the output of the delay element 313 and the node 3. A switch 45 is connected between the output of the delay element 413 and the node 3. A switch 55 is connected between the output of the delay element 513 and the node 3. A switch 65 is connected between the output of the delay element 613 and the node 3. A switch 75 is connected between the output of the delay element 713 and the node 3. A switch 85 is connected between the output of the delay element 813 and the node 3.

A switch 2 renders one and only one of the switches 15, 25, 35, 45, 55, 65, 75, 85 conductive. Thus, depending on which of the switches 15, 25, 35, 45, 55, 65, 75, 85 is conductive, the signal CL0 obtained in the node 3 is respectively equal to the signal output from the delay element 113, the signal output from the delay element 213, the signal output from the delay element 313, the signal output from the delay element 413, the signal output from the delay element 513, the signal output from the delay element 613, the signal output from the delay element 713, or the signal output from the delay element 813.

Figure 3:
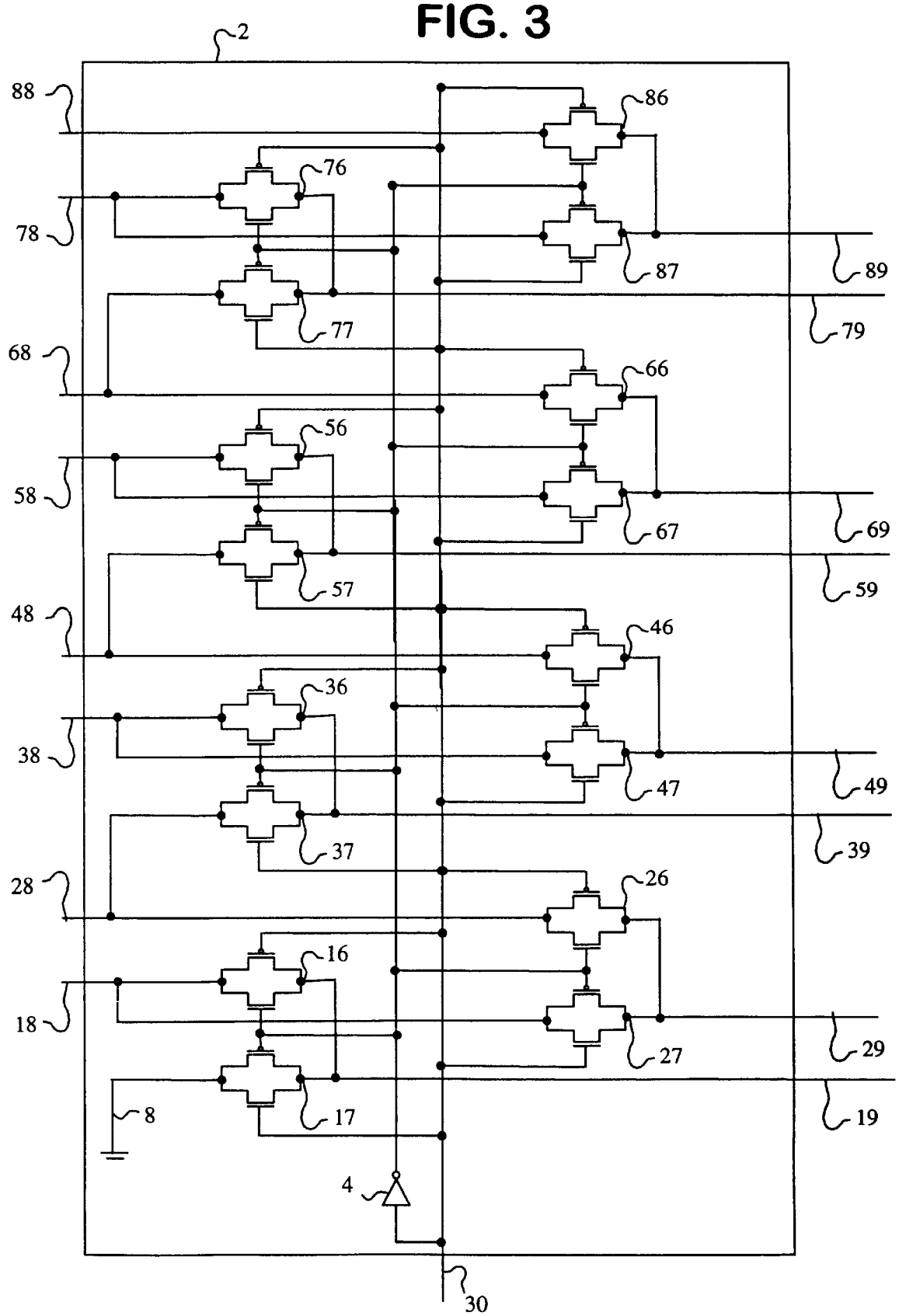
FIG. 3 illustrates an additional detail of a delay cell according to the invention.

The switch 2 is controlled by the signal 30, as will now be explained in greater detail in reference to FIG. 3. At the output of the switch 2, there is a lead 19 for driving the switch 15, a lead 29 for driving the switch 25, a lead 39 for driving the switch 35, a lead 49 for driving the switch 45, a lead 59 for driving the switch 55, a lead 69 for driving the switch 65, a lead 79 for driving the switch 75, a lead 89 for driving the switch 85.

The lead 19 is connected downstream from two switches 16 and 17. The lead 29 is connected downstream from two switches 26 and 27. The lead 39 is connected downstream from two switches 36 and 37. The lead 49 is connected downstream from two switches 46 and 47. The lead 59 is connected downstream from two switches 56 and 47. The lead 69 is connected downstream from two switches 66 and 67. The lead 79 is connected downstream from two switches 76 and 77. The lead 89 is connected downstream from two switches 86 and 87. The signal 30 directly activates the conductive state of the switches 17, 27, 37, 47, 57, 67, 77, 87. An inverted state of the signal 30, obtained by means of an inverter 4, activates the conductive state of the switches 16, 26, 36, 46, 56, 66, 76, 86. A lead 8, connected to the ground, is also connected upstream from the switch 17. A lead 18 is connected upstream from the switch 16 and the switch 27. A lead 28 is connected upstream from the switch 37 and the switch 26. A lead 38 is connected upstream from the switch 36 and the switch 47. A lead 48 is connected upstream from the switches 57 and 46. A lead 58 is connected upstream from the switches 56 and 67. A lead 68 is connected upstream from the switches 77 and 66. A lead 78 is connected upstream from the switches 76 and 87. A lead 88 is connected upstream from the lead 86. Thus, when the signal 30 is at zero, the electrical state of each of the leads 19, 29, 39, 49, 59, 69, 79, 89 is respectively equal to the electrical state of each of the leads 18, 28, 38, 48, 58, 68, 78, 88. When the signal 30 is at 1, the electrical state of each of the leads 19, 29, 39, 49, 59, 69, 79, 89 is respectively equal to the electrical state of each of the leads 8, 18, 28, 38, 48, 58, 68, 78.

Referring to FIG. 2, a decoder 1 receives as input the signal CTL. Each of the leads 18, 28, 38, 48, 58, 68, 78, 88 is connected to the output of the decoder 1. In a known way, the decoder 1 is built to correspond each value of the signal CTL to a high value in one and only one of the leads 18, 28, 38, 48, 58, 68, 78, 88. Thus, the null value of the signal CTL corresponds to the high value in the lead 18 and to the low value in the other leads. The maximum value of the control signal CTL corresponds to the high state in the lead 88 and to the low state in all the other leads. When the signal 30 is at zero, the switch among the switches 15, 25, 35, 45, 55, 65, 76, 85 that is conductive is the one whose rank corresponds to the value of the signal CTL. When the signal 30 is at one, the switch among the switches 15, 25, 35, 45, 55, 65, 75, 85 that is conductive is the one whose rank is immediately above the value of the signal CTL. Thus, for each value of the signal CTL, the signal CL0 obtained in the node 3 is equal to the signal output from the delay element among the elements 113, 213, 313, 413, 513, 613, 713, 813 whose rank is identical to the value of the signal CTL when the signal CTL is at zero, and whose rank is immediately above it when the signal 30 is at one.

Each of the delay cells 131, 132, 133, 134 is identical to the delay cell 130. The preceding explanation in reference to FIG. 2 applies to the cell 131 when replacing the signal 30 with the signal 31, the signal CL0 with the signal CL1, the signal CL with the signal CL0; it applies to the cell 132 when replacing the signal 30 with the signal 32, the signal CL0 with the signal CL2, the signal CL with the signal CL1; it applies to the cell 133 when replacing the signal 30 with the signal 33, the signal CL0 with the signal CL3, the signal CL with the signal CL2; it applies to the cell 134 when replacing the signal 30 with the signal 34, the signal CL0 with the signal CL4, the signal CL with the signal CL3.

When all of the signals 30, 31, 32, 33, 34 are at zero, the delay is identical for all the cells 130, 131, 132, 133, 134. This delay results directly from the signal CTL, which activates a conductive state for the same switch 15, 25, . . . 85 in each of the cells 130, . . . 134. Each signal CL0, CL1, . . . CL4 is therefore obtained downstream from the same number delay element 113, 213, . . . 813 in each cell. The total delay at the output of the last cell 134 relative to the inputs of the first cell 130 is then distributed equally among the outputs of each of the cells.

The invention makes it possible to vary the total delay of the cell chain 130–134 in increments, each equal to an elementary delay obtained through a delay element 113, . . . 813.

Figure 4:
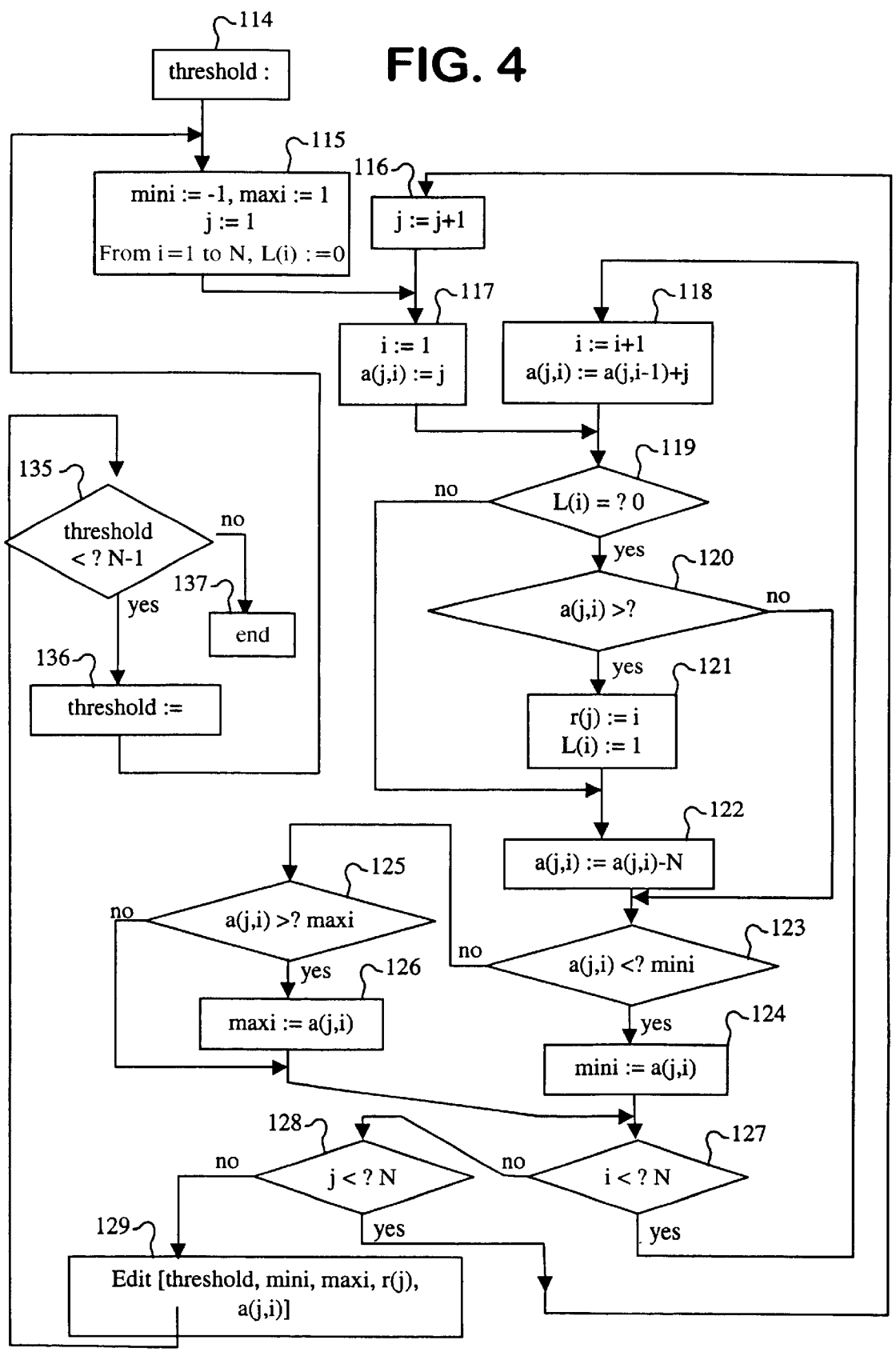
FIG. 4 shows an exemplary implementation of the method according to the invention.

An increase in the delay is obtained by successively setting a signal 30, 31, . . . 34 to one in an order determined by the method explained in reference to FIG. 4. A reduction in the delay is obtained by successively setting a signal 30, . . . 34 to zero in the reverse order.

Referring to FIG. 4, the method comprises a first action loop represented by steps 116 through 128, in which a value j varies from 1 to N. The value j corresponds to an additional delay output from the chain of delay cells 130, . . . 134, equal to j times the elementary delay. The value j is initialized at 1 in a step 115 outside the first loop. An action of the first loop includes a second action loop represented by steps 118 through 127. The second loop is run through successively for values i varying from 1 to N. The value i corresponds to the rank of a cell 130, . . . 134 in the delay cell chain. The value i is initialized at 1 in a step 117 outside the second loop. In the diagram of FIG. 1, the value i=1 represents the rank of the cell 130. For each cell of rank i, a first error a(j, i) is calculated in a step 118.

The value a(j, i) is initialized at j in step 117 for a value of i equal to 1. The cell of rank i=1 is the cell 130 of FIG. 1. To obtain a delay equal to j times the elementary delay output from the last cell 134 in the chain, which distributes this delay identically among the N cells of the chain, an ideal delay output from the first cell 130 is equal to j/N times the elementary delay $T_e$. Prior to activation of an additional elementary delay of the cell 130, the value a(j, 1) is the value of an error relative to the ideal delay, the unit of which is the elementary delay divided by the total number N of cells 130, . . . 134. The convention adopted here means that a positive error value corresponds to a lead relative to the appropriate signal.

Prior to activation of an additional elementary delay of each subsequent cell of rank i receiving as input a signal from the preceding cell with a delay equal to (i−1) times the ideal delay, the error value a(j, i) is equal to j times the same unit for the cell 130, i.e. the elementary delay divided by the number N. When the delay of the signal output by the preceding cell is received with an error value a (j, i−1), the error value a (j, 1) is then equal to a (j, i−1)+j.

In the second loop, a step 118 calculates a first error value for each subsequent cell of rank i=i+1, following the reasoning in the preceding paragraph.

After an activation of step 117, the second loop starts with a step 119 that tests whether a value L(i) is null. For any rank i of a cell in the chain of cells 130, . . . 134, the value L(i) is initialized at zero in a step 115 for initializing the first loop. For each cell of rank i, a null value L(i) indicates that no additional elementary delay has been activated in this cell.

If the test in step 119 is positive, a step 120 tests whether the first error value calculated prior to step 119 is higher than a predetermined threshold. One way to determine a threshold value will be seen below.

If the test in step 120 is positive, a step 121 gives i as the value of a variable r(j). The variable r(j) indicates the rank of the cell for which the application of an additional elementary delay is activated in order to obtain j times the elementary delay output from the chain of delay cells 130, . . . , 134. The value i of the variable r(j) thus completes an order in which the application of an elementary delay in the cells of the delay cell string 130, . . . , 134 is activated. To indicate that the cell of rank i is retained for the application of an additional elementary delay, the value L(i) is set at 1.

A step 122 calculates a second value of the error a(i, j) by subtracting N from the first value of the error a(j, i). In essence, as seen above, the ideal delay unit in each cell is equal to the elementary delay divided by N. Applying an elementary delay to the cell of rank i therefore amounts to subtracting N times the ideal delay from the error a(j, i).

If the test in step 119 is negative, this means that an application of an elementary delay to the cell of rank i has already been activated for previous values of j. Step 122 is then directly activated in order to account for the application of a previous elementary delay to this cell.

If the test in step 120 is negative, the error a(j, i) remains at the first previous value calculated in step 118. Steps 121 and 122 are bypassed so as to directly activate a step 123.

The purpose of the group of steps 123 through 126 is to indicate the highest error value, here called maxi, and the lowest error value, here called mini. An edit of the threshold value used with the minimum and maximum error values, in a step 129 at the output of the loops, makes it possible to assess an influence of the threshold value on the error range [mini, maxi]. The values mini and maxi are initialized in step 115.

Step 123 tests whether the current error value a (j, i) is lower than the current value mini. If the test is positive, the value mini is set at the current error value in step 124. If the test is negative, step 125 tests whether the current error value a (j, i) is higher than the current value maxi. If the test in step 125 is positive, the value maxi is set at the current error value in step 126. If the test is negative, step 126 is bypassed in order to branch directly downstream from step 124.

Step 127 tests whether the rank i is lower than N, i.e. whether the rank i is not the rank of the last cell. If the test is positive, the second loop returns to step 118 in order to execute steps 118 through 127 for a subsequent value i=i+1. If the test is negative, the rank is that of the last cell 134 in the chain of N cells. An elementary delay having been applied to a cell of rank (j), the error a(j, N) is null. A negative test result in step 127 causes the method to exit the second loop in order to execute step 128 of the first loop.

Step 128 tests whether the value j is lower than N. If the test is positive, the first loop returns to step 116 in order to execute steps 116 through 128 for a subsequent value j=j+1. If the test is negative, j=N. The additional delay output from the chain is equal to N times the elementary delay $T_e$, each of the cells is commanded to generate an additional delay equal to the elementary delay $T_e$. A negative test result in step 128 causes the method to exit the first loop in order to execute step 129.

Step 129 edits, for each value of j, the rank r(j) of the chain of cells 130, . . . , 134. The sequence of the values r(j) for j varying from 1 to N determines an order of cells to be delayed with the elementary delay $T_e$ when the additional delay output from the chain changes from the elementary delay $T_e$ to N times the elementary delay $T_e$. A progressive execution of step 129 before step 128 produces the same result. As explained below, the order of cells to be delayed is used to produce the combinational circuit 14.

The threshold value used as predetermined in step 120 is advantageously determined automatically by means of a third loop outside the first loop. The third loop causes the threshold value to vary from a value initialized at zero in a step 114 to a value N−1 tested in a step 135, which brings the method to an end in step 137 when the threshold value reaches the value N−1. Remember that the delay unit in the first loop is equal to $T_e/N$. A maximum threshold value equal to N−1 in the delay unit of the first loop makes it possible to make a correction in a cell of rank i as soon as the error is higher than $T_e*(N-1)/N$, i.e. as soon as the error reaches the elementary delay value $T_e$.

In the third loop, step 129 then edits the order constituted by the ranks r(j), j varying from 1 to N, for the current threshold value. After step 129, step 135 tests whether the threshold is lower than N−1. A positive test triggers a step 136 that increments the threshold value prior to triggering step 115, which then activates the first loop with the new threshold value. The first triggering of step 115 follows step 114. A negative step triggers the end step 137.

The threshold values, the error values mini, maxi, and the order $r(j)_1^N$, edited with each passage through step 129, make it possible, for the production of the combinational circuit 14, to choose the order $r(j)_1^N$, which gives the acceptable errors mini, maxi. An additional piece of information is obtained when step 129 edits, in table form, the errors a (j, i) that result from the first loop. This additional information can potentially be used to guide the choice when several equivalent choices are presented by the third loop.

Figure 5:
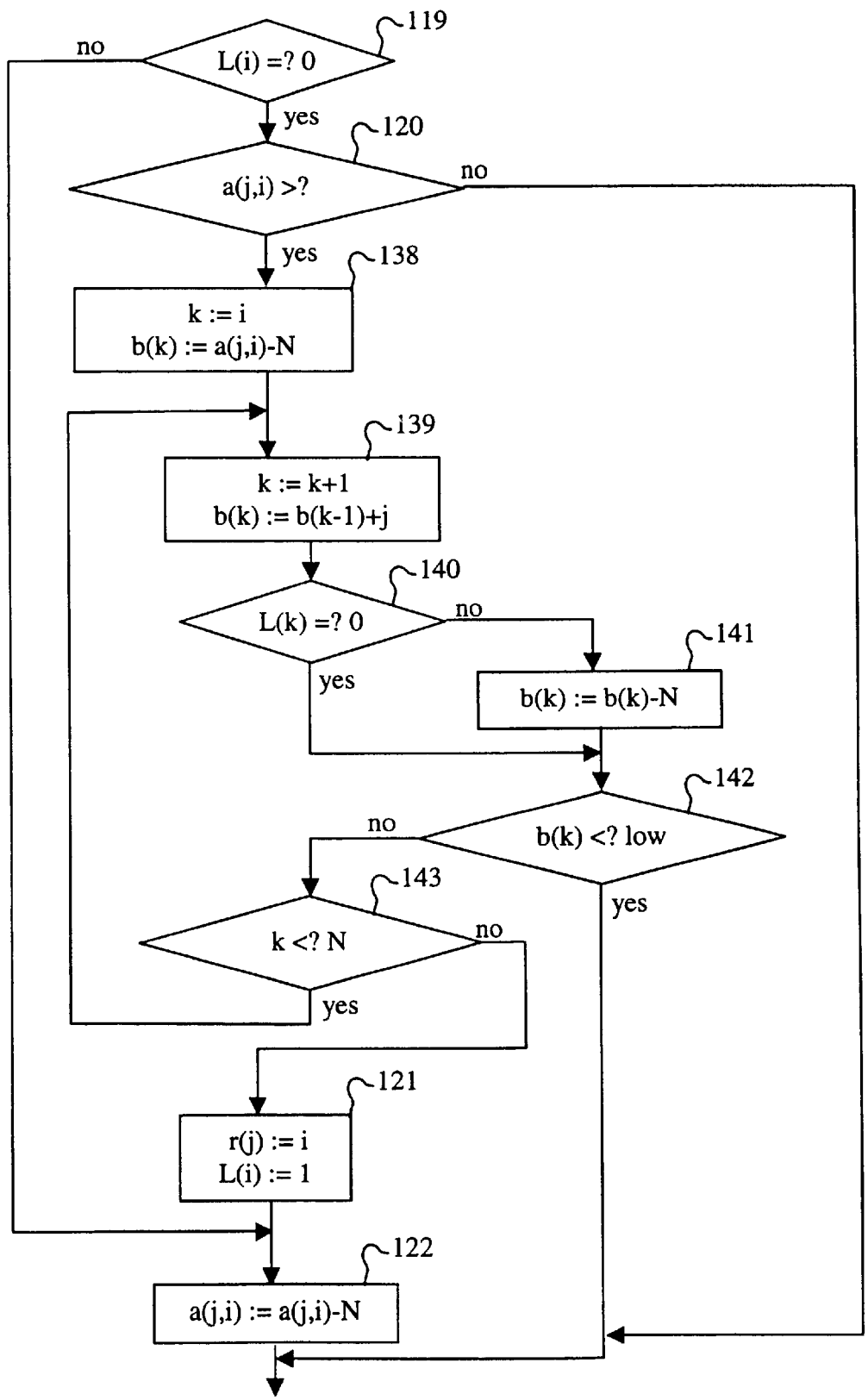
FIGS. 5 and 6 show refinements of the method according to the invention.

FIG. 5 presents additional steps 138 through 143 which, when inserted between steps 120 and 121, make it possible to prevent the error from falling below a negative level that is too low, as a result of a correction in the cell of rank i.

In essence, the order defined by the method is not a successive order from the first to the last cell. When applying the elementary delay to the cell of rank i, it may be that an elementary delay has previously been applied to one or more cells of rank k higher than i.

Steps 139 through 143 constitute a fourth loop that evaluates a third error value b(k) for cell ranks k that follow the rank i of the cell considered in the second loop.

Step 138 initializes the fourth loop with a value of k equal to the current value i and the third error value b(k) with the second error value for the cell of rank i that results if step 122 is executed.

Step 139 then increments the value of k, and for each cell rank k, calculates the resulting error b(k), in a way identical to step 118.

Step 140 verifies that an elementary delay has not already been applied to the cell of rank k. No elementary delay has been applied to the cell of rank k for the values of j lower than the current value of j if L(k)=0. A negative result of the test in step 140 triggers step 141 in order to account for the elementary delay $T_e$, previously applied to the cell of rank k. Just as in step 122, step 141 subtracts from the error b(k) the value N, i.e. N times the $N^{th}$ elementary delay $T_e$, distributed equally among the N cells.

A positive result of the test in step 140 bypasses step 141 in order to leave the error in the first value b(k) calculated in step 139.

Step 142 then tests whether the error value b(k) is lower than a predetermined so-called low value.

A positive result of the test in step 142 causes the method to directly exit from the fourth loop, downstream from step 122. This has the same effect as a negative result of the test in step 120. This means that the elementary delay is not applied to the cell of rank i. The error output from the cell of rank i remains in the first value calculated in step 118.

The low value can, for example, be predetermined so as to be equal to the value 1−N. The fourth loop then prevents the error output from cells of rank k higher than rank i from falling below a negative value equal to 1−N. The second loop being repeated for the subsequent values of i, the additional delay will be applied to another cell. For large values of N, it is possible to choose lower low values.

A negative result of the test in step 142 activates step 139 as long as k is lower than N. When k reaches the value N, the method exits from the fourth loop in order to activate step 121 in a way identical to that described in reference to FIG. 4.

The fourth loop is not indispensable, but it ensures that the error output from any cell in the chain does not fall below a predetermined negative value when the elementary delay $T_e$ is applied to the cell of rank i.

As explained above, the method makes it possible to edit several orders r(j), j varying from 1 to N, each for a predetermined threshold value. Editing minimum and maximum values for each threshold then makes it possible to choose the order that minimizes the errors.

Figure 6:
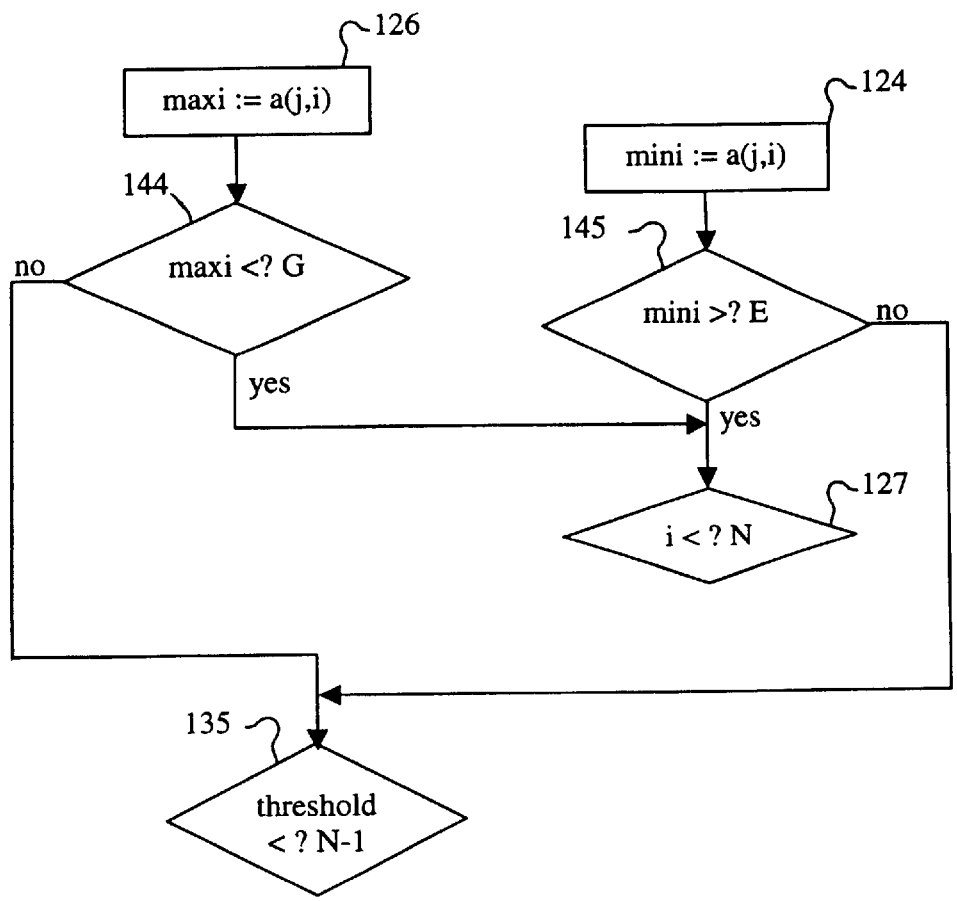

The method is further improved by inserting steps 144 and 145, as will now be described in reference to FIG. 6.

Step 144 is inserted between step 126 and 127. Step 144 tests whether the value maxi determined in step 126 is lower than a value G. A positive result activates step 127 as in the basic method explained in reference to FIG. 4.

A negative result of the test in step 144 causes the method to exit directly from the first loop, activating step 135. Thus, when the error value maxi is higher than G, the order r(j) and the corresponding threshold are not edited in step 129.

The value of G is, for example, taken to be equal to N−1. This ensures that the error output from a cell does not exceed (N−1) times the elementary delay $T_e/N$, which means that the error is lower than the elementary delay $T_e$.

Step 145 is inserted between step 124 and step 127. Step 145 tests whether the value mini determined in step 124 is higher than a value E. A positive result activates step 127 as in the basic method explained in reference to FIG. 4.

A negative result of the test in step 145 causes the method to exit directly from the first loop, activating step 135. Thus, when the error value mini is lower than E, the order r(j) and the corresponding threshold are not edited in step 129.

The value of E is, for example, taken to be equal to 1−N. This ensures that the error output from a cell does not fall below a negative value equal to (N−1) times the elementary delay $T_e/N$, which means that the negative error is lower in absolute value than the elementary delay $T_e$.

This is particularly advantageous for large values of N since not editing orders producing errors that are a priori different facilitates the analysis of the results.

If for certain values of N the limitation of the error between $-T_e$ and $+T_e$ is too restrictive, to the point of not producing any result from the edition, it is possible to increase the value of G and/or reduce the value of E, for example to +N and −N, respectively. Each increase in G and each reduction in E by one unit only increases the error in absolute value by the elementary delay $T_e$ divided by N.

Annex 1 gives an exemplary result edited in step 129 for N=5. In it we see that for a threshold equal to zero, the maximum positive error maxi is equal to 1 and the maximum negative error mini is equal to −4. The smallest error ranges are obtained for a threshold=0 and for a threshold=4.

Figure 7:
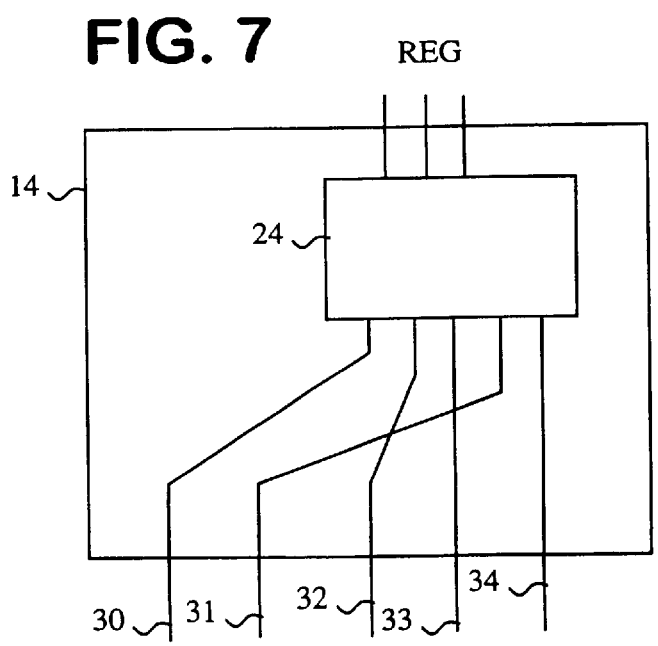
FIG. 7 illustrates a combinational circuit for a particular value of the number of cells.

The choice of an order from the results obtained makes it possible to produce the circuit 14. Let's assume that the order chosen is the one that corresponds to a threshold=0. FIG. 7 presents the circuit produced in order to apply the elementary delay $T_e$ in the order found: 1, 3, 4, 2, 5.

The combinational circuit 14 receives as input the signal REG, wherein the lowest order bit is shown here on the left. The combinational circuit 14 includes a combinational component 24 that generates, in a known way by means of logic gates, the signals REG1, REG2, REG3, REG4, REG5 in accordance with the truth table explained above for N=5.

In order to apply the elementary delay $T_e$ to the cells 130, 131, 132, 133, 134 in the order that results from the method for a threshold equal to 0, the signal REG1 is routed to an output of the circuit 14 that corresponds to the signal 30, the signal REG2 is routed to an output of the circuit 14 that corresponds to the signal 32, the signal REG3 is routed to an output of the circuit 14 that corresponds to the signal 33, the signal REG4 is routed to an output of the circuit 14 that corresponds to the signal 31. The signal REG5 is routed to an output of the circuit 14 that corresponds to the signal 34. Since the signal REG5 is always at zero, it is not necessarily wired to this last output.

Thus, when the signal REG is at zero, the cells 130 through 134 all have the same initial delay controlled by the signal CTL. When the signal REG is at one, an additional elementary delay is applied to the cell 130. When the signal REG is at two, the additional elementary delay is applied to the cells 130 and 132. When the signal REG is at three, the additional elementary delay is applied to the cells 130, 132 and 133. When the signal REG is at four, the additional elementary delay is applied to the cells 130, 132, 133 and 131. When the signal REG exceeds the value four, it is reset to zero and the signal CTL is incremented by one unit, which has the effect of adding to the additional delay an elementary delay applied to each of the cells 130, 132, 133, 131 and 134. The cycle is repeated until the signal CL4 is in phase with the signal CL.

The error produced on output from each cell relative to an ideal delay distributed equally among all the cells is always lower than the elementary delay value $T_e$.

Annex 1

NUMBER OF DELAYS=5

| Spread Table Before Correction in a Correction Cycle (in $T_e/5$) | | | | |
|---|---|---|---|---|
| 1 | 2 | 3 | 4 | 5 |
| 2 | 4 | 6 | 8 | 10 |
| 3 | 6 | 9 | 12 | 15 |
| 4 | 8 | 12 | 16 | 20 |
| 5 | 10 | 15 | 20 | 25 |

For a threshold of=0 we have:
------
positive error maxi=1
negative error maxi=-4
Order found: =======>>1 3 4 2 5<<<======

| residual error table: | | | | |
|---|---|---|---|---|
| -4 | -3 | -2 | -1 | 0 |
| -3 | -1 | -4 | -2 | 0 |
| -2 | 1 | -1 | -3 | 0 |
| -1 | -2 | -3 | -4 | 0 |
| 0 | 0 | 0 | 0 | 0 |

For a threshold of=1 we have:
------
positive error maxi=2
negative error maxi=-4
Order found: =======>>>2 4 1 3 5<<<======

| residual error table: | | | | |
|---|---|---|---|---|
| 1 | -3 | -2 | -1 | 0 |
| 2 | -1 | 1 | -2 | 0 |
| -2 | -4 | -1 | -3 | 0 |
| -1 | -2 | -3 | -4 | 0 |
| 0 | 0 | 0 | 0 | 0 |

For a threshold of=2 we have:
------
positive error maxi=-3
negative error maxi=-4
Order found =======>>>3 2 5 1 4<<<======

| residual error table: | | | | |
|---|---|---|---|---|
| 1 | 2 | -2 | -1 | 0 |
| 2 | -1 | -4 | -2 | 0 |
| 3 | 1 | -1 | 2 | 0 |
| -1 | -2 | -3 | 1 | 0 |
| 0 | 0 | 0 | 0 | 0 |

For a threshold of=3 we have:
------
positive error maxi=3
negative error maxi=-4
Order found: =======>>>4 2 3 1 5<<<======

| residual error table: | | | | |
|---|---|---|---|---|
| 1 | 2 | 3 | -1 | 0 |
| 2 | -1 | 1 | -2 | 0 |
| 3 | 1 | -1 | -3 | 0 |
| -1 | -2 | -3 | -4 | 0 |
| 0 | 0 | 0 | 0 | 0 |

For a threshold of=4 we have:
------
positive error maxi=4
negative error maxi=-1
Order found: =======>>>5 3 2 4 1<<<======

| residual error table: | | | | |
|---|---|---|---|---|
| 1 | 2 | 3 | 4 | 0 |
| 2 | 4 | 1 | 3 | 0 |
| 3 | 1 | -1 | 2 | 0 |
| 4 | 3 | 2 | 1 | 0 |
| 0 | 0 | 0 | 0 | 0 |

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein and defined in the claims.

What is claimed is:

1. An edge multiplier circuit comprising:
    a chain of N phase-looped delay cells for receiving a signal in an order determined by:
        a first action loop for values j varying from 1 to N, each corresponding to a total delay equal to j times an elementary delay of a cell, to be applied to the chain of N delay cells, an action of the first loop comprising a second action loop for values i varying from 1 to N, each corresponding to a rank of a cell in said chain, an action of the second loop calculating a delay error (a (j, i)) output from the cell of rank i relative to an ideal delay that distributes the total delay of the chain equally to each cell, in such a way that:
        a first value of said error is calculated prior to activating an additional elementary delay of the cell of rank i;
        a second value of said error is calculated if the first value is higher than a threshold value, after activating an additional elementary delay of said cell of rank i, said rank i in this case completing said order to be determined.

2. An edge multiplier circuit according to claim 1, further including a third action loop that activates the first action loop for each threshold value with a value varying from zero to N-1.

3. An edge multiplier circuit according to claim 2, characterized in that the second action loop comprises a fourth action loop that verifies that no first error value for cell ranks k higher than the rank i falls below a (low) value, before the completion of this order to be determined by said rank i.

4. An edge multiplier circuit according to claim 1, further including means for calculating a minimum error value and a maximum error value for the threshold value.

5. An edge multiplier circuit according to claim 2, further including means for calculating a minimum error value and a maximum error value for the threshold value.

6. An edge multiplier circuit according to claim 3, further including means for calculating a minimum error value and a maximum error value for the threshold value.

7. An edge multiplier circuit according to claim 4, further including means for editing the threshold value, the minimum and maximum error values, and the order determined at the output of the first loop.

8. An edge multiplier circuit according to claim 5, further including means for editing the threshold value, the minimum and maximum error values, and the order determined at the output of the first loop.

9. An edge multiplier circuit according to claim 6, further including means for editing the threshold value, the minimum and maximum error values, and the order determined at the output of the first loop.

10. An edge multiplier circuit according to claim 7, further including means for editing the error values a(j, i).

11. An edge multiplier circuit according to claim 8, further including means for editing the error values a(j, i).

12. An edge multiplier circuit according to claim 9 further including means for editing the error values a(j, i).

13. A method for determining an order of cells to be delayed in a chain of N phase-looped delay cells comprising
a first action loop for values j varying from 1 to N, each corresponding to a total delay equal to j times an elementary delay of a cell, to be applied to the chain of N delay cells, an action of the first loop comprising a second action loop for values i varying from 1 to N, each corresponding to a rank of a cell in said chain,
calculating by an action of the second loop a delay error (a (j, i)) output from the cell of rank i relative to an ideal delay that distributes the total delay of the chain equally to each cell, so as to calculate a first value of said error prior to activating an additional elementary delay of the cell of rank i; and a second value of said error if the first value is higher than a threshold value, after activating an additional elementary delay of said cell of rank i, said rank i in this case completing said order to be determined.

14. A method for determining an order of cells to be delayed according to claim 13, further comprising a third action loop, activating the first action loop by the third action loop for each threshold value with a value varying from zero to N−1.

15. A method for determining an order of cells to be delayed according to claim 14, wherein the second action loop comprises a fourth action loop that verifies that no first error value for cell ranks k higher than the rank i falls below a (low) value, before the completion of this order to be determined by said rank i.

16. A method for determining an order of cells to be delayed according to claim 13, further comprising calculating a minimum error value and a maximum error value for the threshold value.

17. A method for determining an order of cells to be delayed according to claim 14, further comprising calculating a minimum error value and a maximum error value for the threshold value.

18. A method for determining an order of cells to be delayed according to claim 15, further comprising calculating a minimum error value and a maximum error value for the threshold value.

19. A method for determining an order of cells to be delayed according to claim 16, further comprising editing the threshold value, the minimum and maximum error values, and the order determined at the output of the first loop.

20. A method for determining an order of cells to be delayed according to claim 17, further comprising editing the threshold value, the minimum and maximum error values, and the order determined at the output of the first loop.

21. A method for determining an order of cells to be delayed according to claim 18, comprising editing the threshold value, the minimum and maximum error values, and the order determined at the output of the first loop.

22. A method for determining an order of cells to be delayed according to claim 19, further comprising editing the error values a(j, i).

23. A method for determining an order of cells to be delayed according to claim 20, further comprising editing the error values a(j, i).

24. A method for determining an order of cells to be delayed according to claim 21, further comprising editing the error values a(j, i).

* * * * *